(12) United States Patent
Kimura et al.

(10) Patent No.: US 9,006,709 B2
(45) Date of Patent: Apr. 14, 2015

(54) SEMICONDUCTOR LIGHT EMITTING ELEMENT AND METHOD FOR MANUFACTURING THE SAME

(71) Applicant: Kabushiki Kaisha Toshiba, Minato-ku (JP)

(72) Inventors: Shigeya Kimura, Kanagawa-ken (JP); Hajime Nago, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/180,692

(22) Filed: Feb. 14, 2014

(65) Prior Publication Data

US 2014/0252311 A1   Sep. 11, 2014

(30) Foreign Application Priority Data

Mar. 7, 2013   (JP) .................................. 2013-046008

(51) Int. Cl.
*H01L 29/06* (2006.01)
*H01L 31/0328* (2006.01)
*H01L 27/15* (2006.01)
(Continued)

(52) U.S. Cl.
CPC ............ *H01L 33/06* (2013.01); *H01L 33/0075* (2013.01); *H01L 33/32* (2013.01); *H01L 33/08* (2013.01); *H01L 33/382* (2013.01)

(58) Field of Classification Search
CPC ........ B82Y 20/00; B82Y 10/00; H01L 33/06; H01L 33/0075; H01L 33/0079; H01L 33/32; H01L 33/54; H01L 33/62; H01L 27/15; H01L 21/8252; H01L 2924/01079; H01J 1/34; H01J 2201/3423

USPC .......... 438/22–27, 29, 37, 45–47; 257/11–14, 257/79, 80, 85
See application file for complete search history.

(56) References Cited

U.S. PATENT DOCUMENTS

| 2002/0182765 A1 | 12/2002 | Tran et al. |
| 2008/0035910 A1 | 2/2008 | Kyono et al. |
| 2013/0087761 A1* | 4/2013 | Kimura et al. .................. 257/13 |

FOREIGN PATENT DOCUMENTS

| JP | 2002-359439 A | 12/2002 |
| JP | 2011-96893 | 5/2011 |

(Continued)

OTHER PUBLICATIONS

Extended European Search Report issued Oct. 6, 2014 in Patent Application No. 14155514.4.
Shigefusa Chichibu, et al., "Exciton localization in InGaN quantum well devices", Journal of Vacuum Science & Technology B: Microelectronicsprocessing and Phenomena,American Vacuum Society, vol. 16, No. 4, XP 012006995, (Jul./Aug. 1998), pp. 2204-2214.

*Primary Examiner* — Hsien Ming Lee
(74) *Attorney, Agent, or Firm* — Oblon, McClelland, Maier & Neustadt, L.L.P.

(57) ABSTRACT

According to one embodiment, a semiconductor light emitting element includes a first semiconductor layer of an n-type, a second semiconductor layer of a p-type, and a light emitting unit. The first semiconductor layer includes a nitride semiconductor. The second semiconductor layer includes a nitride semiconductor. The light emitting unit is provided between the first semiconductor layer and the second semiconductor layer. The light emitting unit includes a plurality of well layers stacked alternately with a plurality of barrier layers. The well layers include a first p-side well layer most proximal to the second semiconductor layer, and a second p-side well layer second most proximal to the second semiconductor layer. A localization energy of excitons of the first p-side well layer is smaller than a localization energy of excitons of the second p-side well layer.

20 Claims, 4 Drawing Sheets

(51) Int. Cl.
*H01L 21/00* (2006.01)
*H01L 33/06* (2010.01)
*H01L 33/00* (2010.01)
*H01L 33/08* (2010.01)
*H01L 33/32* (2010.01)
*H01L 33/38* (2010.01)

(56) References Cited

FOREIGN PATENT DOCUMENTS

| | | |
|---|---|---|
| JP | 2012-129573 | 7/2012 |
| JP | 2012-244163 | 12/2012 |

\* cited by examiner

SEMICONDUCTOR LIGHT EMITTING ELEMENT AND METHOD FOR MANUFACTURING THE SAME

CROSS-REFERENCE TO RELATED APPLICATIONS

This application is based upon and claims the benefit of priority from Japanese Patent Application No. 2013-046008, filed on Mar. 7, 2013; the entire contents of which are incorporated herein by reference.

FIELD

Embodiments described herein relate generally to a semiconductor light emitting element and a method for manufacturing the same.

BACKGROUND

Group III-V nitride compound semiconductors such as gallium nitride (GaN) and the like are being applied to semiconductor light emitting elements such as light emitting diodes (LEDs), laser diodes (LDs), etc. It is desirable to increase the efficiency of such semiconductor light emitting elements.

DETAILED DESCRIPTION

According to one embodiment, a semiconductor light emitting element includes a first semiconductor layer of an n-type, a second semiconductor layer of a p-type, and a light emitting unit. The first semiconductor layer includes a nitride semiconductor. The second semiconductor layer includes a nitride semiconductor. The light emitting unit is provided between the first semiconductor layer and the second semiconductor layer. The light emitting unit includes a plurality of well layers stacked alternately with a plurality of barrier layers. The well layers include a first p-side well layer most proximal to the second semiconductor layer, and a second p-side well layer second most proximal to the second semiconductor layer. A localization energy of excitons of the first p-side well layer is smaller than a localization energy of excitons of the second p-side well layer.

According to one embodiment, a method for manufacturing a semiconductor light emitting element is disclosed. The method can include forming a first semiconductor layer of an n-type including a nitride semiconductor, forming a light emitting unit including a plurality of well layers and a plurality of barrier layers by alternately stacking the well layers with the barrier layers on the first semiconductor layer, and forming a second semiconductor layer of a p-type including a nitride semiconductor on the light emitting unit. The well layers include a first p-side well layer most proximal to the second semiconductor layer, and a second p-side well layer second most proximal to the second semiconductor layer. A localization energy of excitons of the first p-side well layer is smaller than a localization energy of excitons of the second p-side well layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1A:
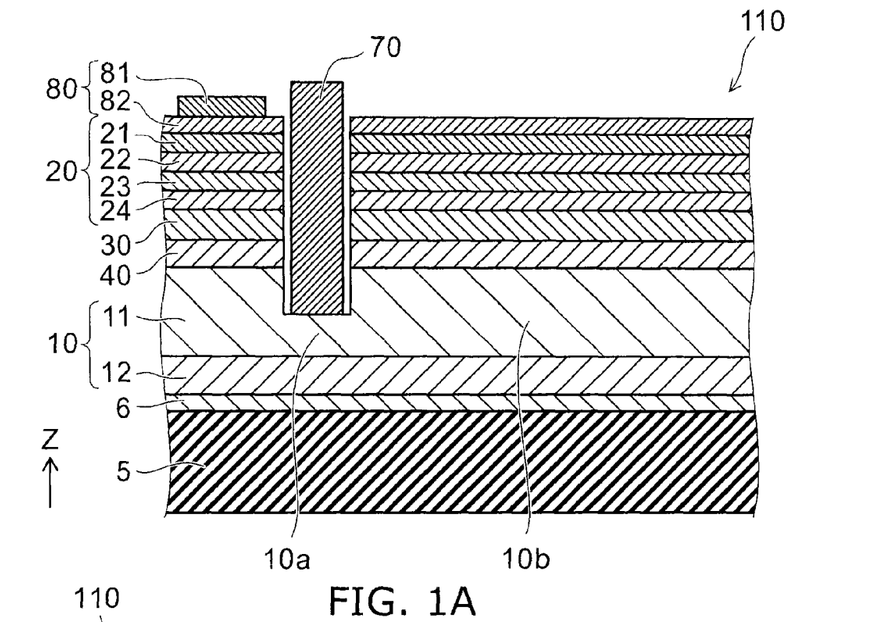
FIG. 1A and FIG. 1B are schematic cross-sectional views showing a semiconductor light emitting element according to a first embodiment.
Figure 1B:
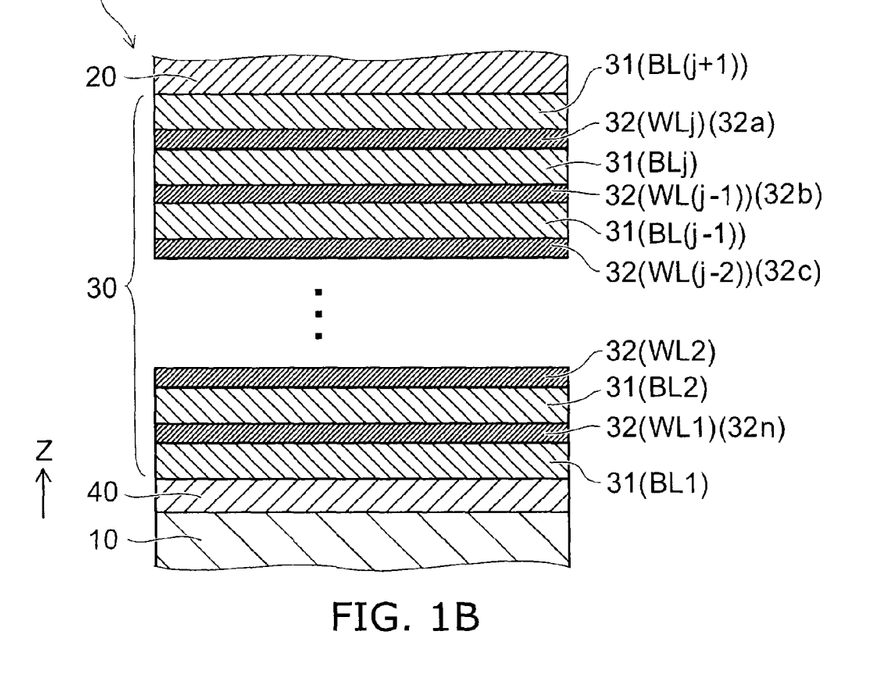

FIG. 1A and FIG. 1B are schematic cross-sectional views illustrating a semiconductor light emitting element according to a first embodiment.

FIG. 1B shows a portion of FIG. 1A.

As shown in FIG. 1A, the semiconductor light emitting element 110 according to the embodiment includes a first semiconductor layer 10, a second semiconductor layer 20, and a light emitting unit 30. The light emitting unit 30 is provided between the first semiconductor layer 10 and the second semiconductor layer 20.

The first semiconductor layer 10 includes a nitride semiconductor. The first semiconductor layer 10 is an n-type. The second semiconductor layer 20 includes a nitride semiconductor. The second semiconductor layer 20 is a p-type.

In the example, a buffer layer 6 is provided on a substrate 5; and the first semiconductor layer 10, a multilayered structural body 40, the light emitting unit 30, and the second semiconductor layer 20 are provided on the buffer layer 6.

The substrate 5 includes, for example, a sapphire substrate (e.g., a c-plane sapphire substrate). The substrate 5 may include, for example, a substrate of Si, GaN, SiC, ZnO, etc.

The buffer layer 6 includes, for example, at least one selected from an AlN layer, an AlGaN layer, and a GaN layer or a stacked film including these layers.

The first semiconductor layer 10 includes, for example, an n-type impurity. For example, Si is used as the n-type impurity. For example, Ge, Sn, etc., may be used as the n-type impurity.

In the example, the first semiconductor layer 10 includes a first n-side layer 11 and a second n-side layer 12. The first n-side layer 11 is disposed between the second n-side layer 12 and the light emitting unit 30 (in the example, between the second n-side layer 12 and the multilayered structural body 40).

The first n-side layer 11 is, for example, an n-side contact layer. The first n-side layer 11 includes, for example, n-type GaN. The second n-side layer 12 includes GaN. The impurity concentration of the first n-side layer 11 is higher than the impurity concentration of the second n-side layer 12.

The second semiconductor layer 20 includes, for example, a p-type impurity. For example, Mg is used as the p-type impurity. For example, Zn, etc., may be used as the p-type impurity.

In the example, the second semiconductor layer 20 includes a first p-side layer 21, a second p-side layer 22, a third p-side layer 23, and a fourth p-side layer 24. The second p-side layer 22 is provided between the first p-side layer 21 and the light emitting unit 30. The third p-side layer 23 is provided between the second p-side layer 22 and the light emitting unit 30. The fourth p-side layer 24 is provided between the third p-side layer 23 and the light emitting unit 30. The first p-side layer 21 is, for example, a p-side contact layer. The first p-side layer 21 includes p-type GaN having a high impurity concentration. The second p-side layer 22 includes p-type GaN. The impurity concentration of the first p-side layer 21 is higher than the impurity concentration of the second p-side layer 22. The third p-side layer 23 includes, for example, p-type AlGaN. The fourth p-side layer 24 includes, for example, AlGaN. The third p-side layer 23 functions as, for example, an electron overflow suppression layer.

A direction from the first semiconductor layer 10 toward the second semiconductor layer 20 is taken as a Z-axis direction (a stacking direction).

The multilayered structural body 40 includes multiple first layers (not shown) stacked with multiple second layers (not shown). The first layers are stacked with the second layers along the Z-axis direction. The first layer includes, for example, GaN; and the second layer includes, for example, InGaN. The multilayered structural body 40 is, for example, a superlattice layer. The multilayered structural body 40 may be provided if necessary and may be omitted.

A first electrode 70 and a second electrode 80 are further provided in the example. The first electrode 70 is electrically connected to the first semiconductor layer 10. The second electrode 80 is electrically connected to the second semiconductor layer 20.

In the example, a trench is made in the second semiconductor layer 20, the light emitting unit 30, and the multilayered structural body 40; and the first electrode 70 is connected to the first n-side layer 11 at the bottom surface of the trench. In other words, the first semiconductor layer 10 (the first n-side layer 11) has a first portion 10a and a second portion 10b. The second portion 10b is arranged with the first portion 10a in a plane intersecting the Z-axis direction (the stacking direction). The first electrode 70 is connected to the first portion 10a. The light emitting unit 30 is provided between the second portion 10b and the second semiconductor layer 20.

The first electrode 70 includes, for example, a stacked film of a Ti film/Pt film/Au film. The thickness of the Ti film is, for example, 0.05 μm. The thickness of the Pt film is, for example, 0.05 μm. The thickness of the Au film is, for example, 1.0 μm.

In the example, the second electrode 80 includes a first conductive unit 81 and a second conductive unit 82. The second conductive unit 82 is provided between the first conductive unit 81 and the second semiconductor layer 20. The second conductive unit 82 contacts the second semiconductor layer 20. The second conductive unit 82 includes, for example, a conductive material that is light-transmissive. The second conductive unit 82 includes, for example, an oxide including at least one element selected from the group consisting of In, Sn, Zn, and Ti. The second conductive unit 82 includes, for example, ITO (Indium Tin Oxide), etc. The thickness of the second conductive unit 82 is, for example, 0.2 μm.

The first conductive unit 81 is electrically connected to the second conductive unit 82. The first conductive unit 81 is provided on a portion of the second conductive unit 82. The first conductive unit 81 includes, for example, a stacked film of a Ni film/Au film. The thickness of the Ni film is, for example, 0.05 μm. The thickness of the Au film is, for example, 1.0 μm.

A current flows in the light emitting unit 30 via the first semiconductor layer 10 and the second semiconductor layer 20 by applying a voltage between the first electrode 70 and the second electrode 80. Thereby, light is emitted from the light emitting unit 30. The peak wavelength of the emitted light is, for example, not less than 370 nanometers (nm) and not more than 650 nm. The semiconductor light emitting element 110 is, for example, an LED.

In the example, the light that is emitted from the light emitting unit 30 is emitted to the outside mainly from the second semiconductor layer 20 side (the second electrode 80 side). In other words, the second semiconductor layer 20 side is used as the light emitting surface.

For example, the light that is emitted from the light emitting unit 30 may be emitted to the outside mainly from the first semiconductor layer 10 side. In other words, the first semiconductor layer 10 side may be used as the light emitting surface.

For example, the buffer layer 6, the first semiconductor layer 10, the multilayered structural body 40, the light emitting unit 30, and the second semiconductor layer 20 are formed on the substrate 5. The formation is performed by epitaxial growth. The epitaxial growth is performed by, for example, metal organic chemical vapor deposition (MOCVD), molecular beam epitaxy (MBE), hydride vapor phase epitaxy (HYPE), etc. The substrate 5 may be removed after the formation of these layers.

As shown in FIG. 1B, the light emitting unit 30 includes multiple well layers 32 stacked alternately with multiple barrier layers 31. The multiple well layers 32 and the multiple barrier layers 31 are disposed alternately along the Z-axis direction (the stacking direction). The light emitting unit 30 has a multiple quantum well (MQW) configuration.

The bandgap energy of the well layers 32 is less than the bandgap energy of the multiple barrier layers 31. The thickness of the well layers 32 is thinner than, for example, the thickness of the barrier layers 31. The thickness of the well layers 32 is, for example, not less than 3 nm and not more than 6 nm. The thickness of the barrier layers 31 is, for example, not less than 3 nm and not more than 10 nm.

The well layers 32 include, for example, $In_wGa_{1-w}N$ ($0<w<1$). The barrier layers 31 include, for example, $In_bGa_{1-b}N$ ($0 \leq b<1$ and $b<w$). The well layers 32 include, for example, InGaN. The barrier layers 31 include, for example, GaN. For example, the barrier layers 31 substantially do not include In. In the case where the barrier layers 31 include In, the In composition ratio of the barrier layers 31 is lower than the In composition ratio of the well layers 32.

For example, the light emitting unit 30 includes j+1 barrier layers 31 and j well layers 32 U being an integer not less than 2). The (i+1)th barrier layer BL(i+1) is disposed between the ith barrier layer BLi and the second semiconductor layer 20 (i being an integer not less than 1 and not more than j−1). The (i+1)th well layer WL(i+1) is disposed between the ith well layer WLi and the second semiconductor layer 20. The first barrier layer BL1 is provided between the first semiconductor layer 10 and the first well layer WL1. The jth well layer WLj is provided between the jth barrier layer BLj and the (j+1)th barrier layer BL(j+1). The (j+1)th barrier layer BL(j+1) is provided between the jth well layer WLj and the second semiconductor layer 20.

As shown in FIG. 1B, the multiple well layers 32 include a first p-side well layer 32a and a second p-side well layer 32b. Among the multiple well layers 32, the first p-side well layer 32a is most proximal to the second semiconductor layer 20. Among the multiple well layers 32, the second p-side well layer 32b is second most proximal to the second semiconductor layer 20. The multiple well layers 32 may further include a third p-side well layer 32c. Among the multiple well layers 32, the third p-side well layer 32c is third most proximal to the second semiconductor layer 20.

The first p-side well layer 32a corresponds to the jth well layer WLj. The second p-side well layer 32b corresponds to the (j−1)th well layer WL(j−1). The third p-side well layer 32c corresponds to the (j−2)th well layer WL(j−2). The first well layer WL1 is jth most proximal to the second semiconductor layer 20. Among the multiple well layers 32, the first well layer WL1 is most proximal to the first semiconductor layer 10. The first well layer WL1 corresponds to, for example, an n-side well layer 32n.

In the embodiment, the localization energy of excitons of the first p-side well layer 32a is set to be less than the localization energy of excitons of the second p-side well layer 32b.

Thereby, the well layer 32 (the second p-side well layer 32b) that is on the first semiconductor layer 10 side and has a low carrier density can be configured to be not easily affected by defects. Thereby, the proportion of the non-radiative recombination component in the exciton recombination in each of the multiple well layers 32 can be suppressed. In other words, the non-radiative recombination rate of the well layer 32 (the second p-side well layer 32b) on the first semiconductor layer 10 side decreases; and the internal quantum efficiency increases. Thereby, the luminous efficiency can be increased.

A luminous efficiency Eff of the light emitting unit 30 is represented by, for example, the first formula recited below.

$$Eff = Bn^2/(An + Bn^2 + Cn^3) \quad (1)$$

In the first formula, n is the carrier density that is injected. Coefficient A is the Shockley-Read-Hall constant. The An term corresponds to the crystal defect non-radiative process of the light emitting unit 30. Coefficient B is the radiative recombination constant. The $Bn^2$ term corresponds to the radiative recombination process. Coefficient C is the Auger constant. The $Cn^3$ term corresponds to the Auger non-radiative process. Here, leakage of the carriers is ignored. The term in the first formula that contributes to the radiative recombination process is the $Bn^2$ term.

Figure 2A:
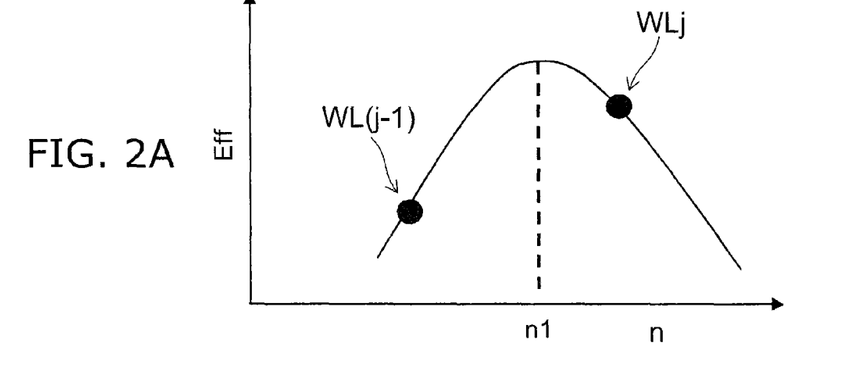
FIG. 2A and FIG. 2B are graphs showing characteristics of the semiconductor light emitting element.
Figure 2B:
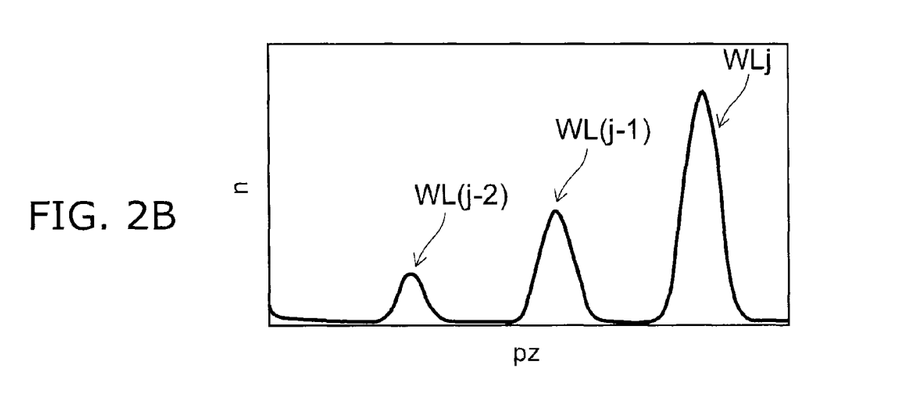

FIG. 2A and FIG. 2B are graphs illustrating characteristics of the semiconductor light emitting element.

In FIG. 2A, the horizontal axis is the logarithm of the carrier density n injected into the light emitting unit 30. In FIG. 2A, the vertical axis is the luminous efficiency Eff.

In FIG. 2B, the horizontal axis is a Z-axis direction position pz. In FIG. 2B, the vertical axis is the carrier density n. FIG. 2B shows the carrier density n for a portion of the multiple well layers 32.

As shown in FIG. 2A, the luminous efficiency Eff has a peak as the carrier density n changes. This is because the luminous efficiency Eff is represented by the first formula recited above. In FIG. 2A, the luminous efficiency Eff decreases due to defects in the region where the carrier density n is lower than a carrier density n1 at which the luminous efficiency Eff has the peak.

It can be seen from FIG. 2A that, to obtain a high luminous efficiency Eff, an appropriate carrier density n exists.

On the other hand, as shown in FIG. 2B, the carrier density n of the jth well layer WLj (the first p-side well layer 32a) most proximal to the second semiconductor layer 20 is high. The carrier density n is lower for the (j−1)th well layer WL(j−1) (the second p-side well layer 32b) second most proximal to the second semiconductor layer 20 than for the jth well layer WLj. The carrier density n of the (j−2)th well layer WL(j−2) (the third p-side well layer 32c) third most proximal to the second semiconductor layer 20 is even lower.

For example, as shown in FIG. 2A, a relatively high luminous efficiency Eff of the jth well layer WLj is obtained by adjusting the current flowing in the entire light emitting unit 30. However, at such a condition, the luminous efficiency Eff of the (j−1)th well layer WL(j−1) having a low carrier density is undesirably low.

Thus, the effects of the defects cause the luminous efficiency to decrease more easily for the well layers 32 distal to the p-type second semiconductor layer 20 because the carrier density n is low.

It is considered that coefficient A (the Shockley-Read-Hall constant) of the An term of the first formula depends on the localization energy of excitons of the well layer 32. Coefficient A which corresponds to the crystal defect non-radiative process can be reduced by increasing the localization energy of excitons of the well layer 32.

For example, in the case where the localization energy of excitons is large, the carriers no longer move easily in the plane of the well layer 32. Therefore, carriers that are proximal to the defects occurring in the well layer 32 are suppressed. Thereby, the crystal defect non-radiative process is suppressed. Conversely, in the case where the localization energy of excitons is small, the carriers move easily in the plane of the well layer 32; the carriers approach the defects; and as a result, the crystal defect non-radiative process occurs easily.

Figure 3:
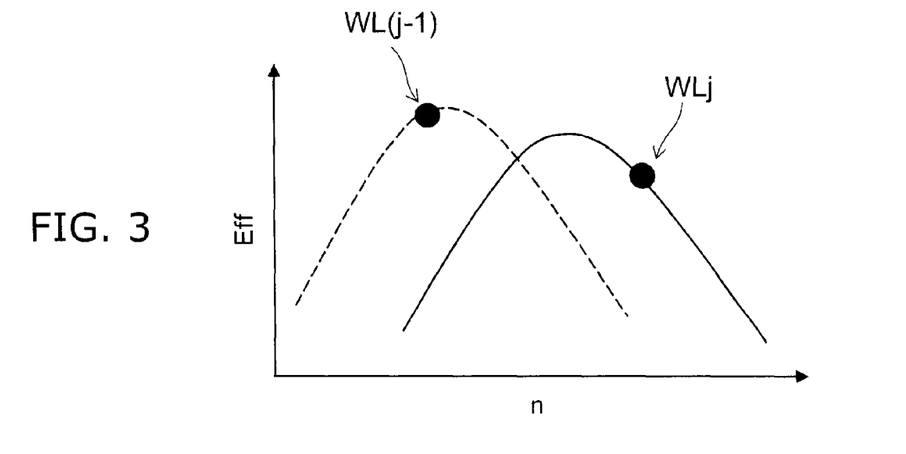
FIG. 3 is a graph showing characteristics of the semiconductor light emitting element.

FIG. 3 is a graph illustrating characteristics of the semiconductor light emitting element.

In FIG. 3, the horizontal axis is the logarithm of the carrier density n injected into the light emitting unit 30. In FIG. 3A, the vertical axis is the luminous efficiency.

In the embodiment, for example, the localization energy of excitons is modified for each of the multiple well layers 32. In the example, the localization energy of excitons is modified for the jth well layer WLj (the first p-side well layer 32a) and the (j−1)th well layer WL(j−1) (the second p-side well layer 32b). Accordingly, as shown in FIG. 3, two types of curves are obtained.

For example, the localization energy of excitons is modified to match the carrier density n of each of the well layers 32 to obtain a high luminous efficiency Eff. Thereby, a high luminous efficiency Eff is obtained for each of the multiple well layers 32.

For the second p-side well layer 32b in the embodiment, the crystal defect non-radiative process is suppressed by increasing the localization energy of excitons. Thereby, a high luminous efficiency is obtained even for a low carrier concentration. On the other hand, the localization energy of excitons is reduced for the well layer 32 (the first well layer 32a) proximal to the p-side. Thereby, a high luminous efficiency that corresponds to the high carrier concentration is obtained.

Thus, according to the embodiment, a highly efficient semiconductor light emitting element can be provided.

It is favorable for the localization energy of excitons of the first p-side well layer 32a on the p-side to be less than 50 milli-electron volts (meV). It is more favorable to be less than 40 meV. It is even more favorable to be less than 30 meV.

It is favorable for the localization energy of excitons of the second p-side well layer 32b on the n-side to be 30 meV or more. It is more favorable to be 40 meV or more. It is even more favorable to be 50 meV or more.

For example, the number of the multiple well layers 32 for which the localization energy of excitons is larger than that of the first p-side well layer 32a may be one or multiple. The localization energy of excitons of at least the second p-side well layer 32b is larger than that of the first p-side well layer 32a. For example, the localization energy of excitons of the third p-side well layer 32c also may be larger than that of the first p-side well layer 32a.

For example, the localization energy of excitons of the multiple well layers 32 may decrease from the first semiconductor layer 10 side toward the second semiconductor layer 20 side. For example, the localization energy of excitons of the multiple well layers 32 may decrease continuously or in a step configuration from the first semiconductor layer 10 side toward the second semiconductor layer 20 side.

The carrier density n is highest for the first p-side well layer 32a most proximal to the second semiconductor layer 20 on the p-side. The radiative recombination probability when the carrier density is high can be increased by reducing such a localization energy of excitons of the first p-side well layer 32a.

The carrier density of the second p-side well layer 32b second most proximal to the second semiconductor layer 20 is remarkably lower than that of the first p-side well layer 32a. Therefore, the increase of the non-radiative recombination probability of the second p-side well layer 32b can be suppressed effectively by setting the localization energy of excitons of the second p-side well layer 32b to be larger than that of the first p-side well layer 32a.

The localization energy of excitons can be determined from, for example, the temperature dependency of the integrated intensity of the photoluminescence (PL). The localization energy of excitons may be determined from, for example, the results of time-resolved PL measurements.

It is considered that the size of the localization energy of excitons depends on the state of fluctuations of the well layer 32. The level of the localization energy of excitons can be controlled for each of the layers by controlling the state of fluctuations of each of the multiple well layers 32.

For example, the localization energy of excitons of the well layer 32 is large when the fluctuation of the In concentration distribution in the layer of the well layer 32 is high. The localization energy of excitons of the well layer 32 is small in the case where the fluctuation of the In concentration in the layer of the well layer 32 is high. Such fluctuation of the In concentration is, for example, the fluctuation in the plane in a region having a diameter not more than 100 nm.

For example, the localization energy of excitons of the well layer 32 is large when the fluctuation of the thickness of the well layer 32 is high. The localization energy of excitons of the well layer 32 is small when the fluctuation of the thickness of the well layer 32 is low. Such fluctuation of the thickness is, for example, the fluctuation in the plane in a region having a diameter not more than 100 nm.

In the embodiment, for example, the fluctuation of the In concentration of the second p-side well layer 32b is set to be higher than the fluctuation of the In concentration of the first p-side well layer 32a. For example, the fluctuation of the thickness of the second p-side well layer 32b is set to be higher than the fluctuation of the thickness of the first p-side well layer 32a. In the embodiment, for example, the second p-side well layer 32b has at least one state selected from the fluctuation of the In concentration being higher than the fluctuation of the In concentration of the first p-side well layer 32a and the fluctuation of the thickness being higher than the fluctuation of the thickness of the first p-side well layer 32a.

For the well layer 32, the fluctuation of the In concentration or the fluctuation of the thickness can be controlled by, for example, the formation conditions when growing the light emitting unit 30. For example, the localization energy of excitons can be controlled by the formation conditions of the light emitting unit 30.

For the well layer 32, the fluctuation of the In concentration and the fluctuation of the thickness can be determined by, for example, three dimensional atom probe analysis.

Figure 4:
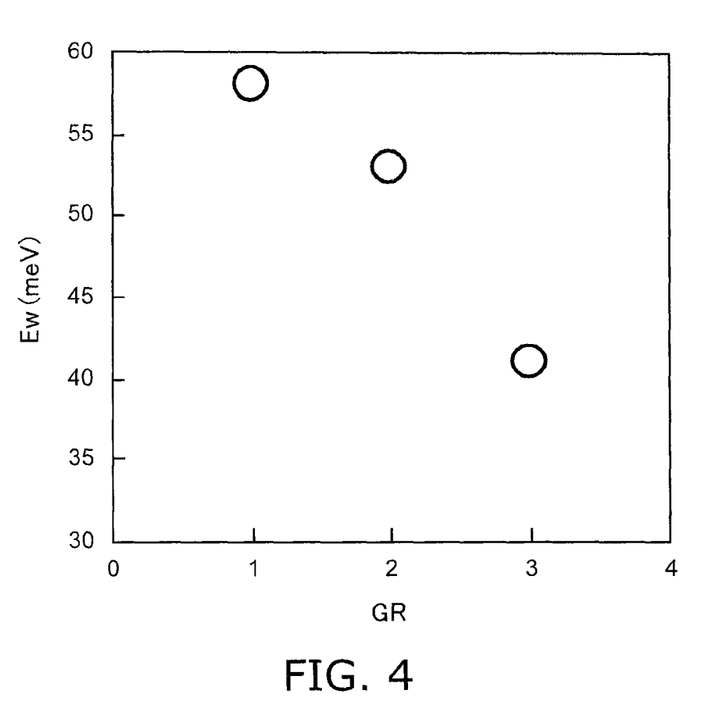
FIG. 4 is a graph showing characteristics of the semiconductor light emitting element.

FIG. 4 is a graph illustrating characteristics of the semiconductor light emitting element.

FIG. 4 shows an example of the relationship between the growth rate when forming the well layer 32 and the localization energy of excitons of the well layer 32. In FIG. 4, the horizontal axis is the growth rate GR (a relative value). The vertical axis is the localization energy Ew (meV) of excitons. In the example shown in FIG. 4, the growth rate GR is changed by changing the supply amount of the source material used when forming the well layer 32. In the example, the supply flow rate of tri-methyl gallium (TMG) is modified.

It can be seen from FIG. 4 that the localization energy Ew of excitons is changed by changing the growth rate GR of the well layer 32. The localization energy Ew of excitons is small when the growth rate GR is high. The localization energy Ew of excitons is large when the growth rate GR is low. In the example, a localization energy Ew of about 41 meV to about 58 meV is obtained.

In the embodiment, for example, the growth rate of the second p-side well layer 32b is set to be lower (slower) than the growth rate of the first p-side well layer 32a. For example, a localization energy of excitons of about 58 meV is obtained by forming the second p-side well layer 32b at a growth rate GR having a relative value of 1. For example, a localization energy of excitons of about 41 meV is obtained by forming the first p-side well layer 32a at a growth rate GR having a relative value of 3.

Figure 5:
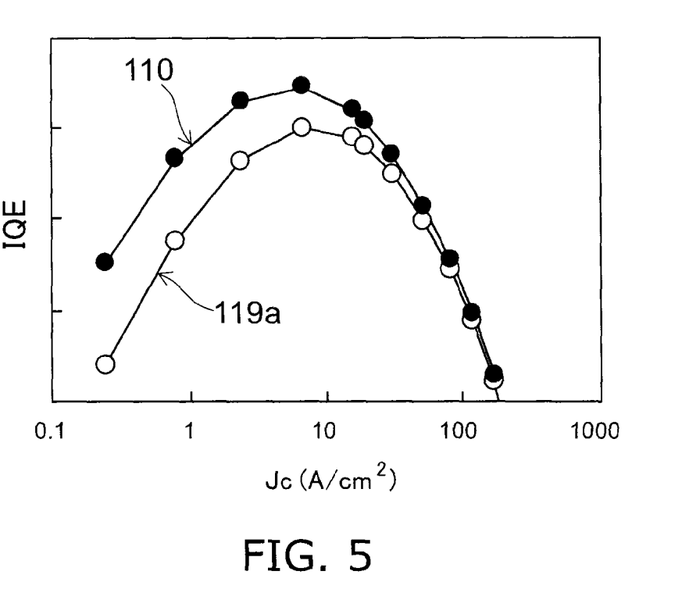
FIG. 5 is a graph showing characteristics of semiconductor light emitting elements.

FIG. 5 is a graph illustrating characteristics of semiconductor light emitting elements.

FIG. 5 shows an example of simulation results of the internal quantum efficiency of the semiconductor light emitting element 110 according to the embodiment. In the example, the number of the well layers 32 is eight. In the example, the localization energy of excitons is 30 meV for the first p-side well layer 32a of the multiple well layers 32 that is most proximal to the second semiconductor layer 20. For the other well layers (the seven well layers 32), the localization energy of excitons is 60 meV. In other words, in the example, the localization energy of excitons of the second p-side well layer 32b is 60 mV.

FIG. 5 also shows the characteristic of a semiconductor light emitting element 119a of a first reference example (the structure is not shown). In the semiconductor light emitting element 119a, the localization energy of excitons is the same between the multiple well layers 32. In other words, the localization energy of excitons is 30 meV for all eight of the well layers 32. Otherwise, the conditions of the semiconductor light emitting element 119a are the same as those of the semiconductor light emitting element 110.

In FIG. 5, the horizontal axis is a current density Jc (A/cm$^2$). The vertical axis is an internal quantum efficiency IQE (a relative value).

It can be seen from FIG. 5 that a higher luminous efficiency is obtained for the semiconductor light emitting element 110 according to the embodiment than for the semiconductor light emitting element 119a of the first reference example.

This is a result of the suppression of the non-radiative recombination of excitons of the well layers 32 other than the first p-side well layer 32a. As described in regard to FIG. 2B, the carrier density n decreases as the distance from the multiple well layers 32 to the second semiconductor layer 20 increases. Practically, a high efficiency is obtained by suppressing the non-radiative recombination of excitons of the second p-side well layer 32b second most proximal to the second semiconductor layer 20.

As described above, for the well layer 32, the fluctuation of the In concentration and the fluctuation of the thickness can be determined by, for example, three dimensional atom probe analysis. An example of measurement results of the fluctuation of the In concentration will now be described.

For example, the distribution of the In concentration of the well layer 32 is measured by a three dimensional atom probe. For the measurement region of the In concentration distribution of the well layer 32, the width along the Z-axis direction is 2 nm; the width along the X-axis direction is 20 nm; and the width along the Y-axis direction is 20 nm. Such a measurement region is divided into multiple regions. For each of the multiple regions, the width along the Z-axis direction is 2 nm; the width along the X-axis direction is 2 nm; and the width along the Y-axis direction is 2 nm. The In concentration of each of such multiple regions is determined from the measurement results of the In concentration distribution. Then, the fluctuation of the In concentration in the plane of one well layer 32 is determined from the value of the In concentration of each of the multiple regions. The fluctuation is represented as the standard deviation δ.

In the semiconductor light emitting element 110 according to the embodiment, the standard deviation δ of the In concentration of the eighth well layer WL8 (the first p-side well layer 32a) is, for example, 1.08 atm % (atomic percent). On the other hand, the standard deviation δ of the In concentration of the seventh well layer WL7 (the second p-side well layer 32b) is, for example, 1.24 atm %. In other words, the standard deviation δ of the In concentration of the eighth well layer WL8 (the first p-side well layer 32a) is less than the standard deviation δ of the In concentration of the seventh well layer WL7 (the second p-side well layer 32b). This corresponds to the localization energy of excitons of the eighth well layer WL8 (the first p-side well layer 32a) being less than the localization energy of the seventh well layer WL7 (the second p-side well layer 32b).

On the other hand, in the semiconductor light emitting element 119a of the first reference example, the standard deviation δ of the In concentration of the eighth well layer WL8 (the first p-side well layer 32a) is 1.17 atm %. The standard deviation δ of the In concentration of the seventh well layer WL7 (the second p-side well layer 32b) is 1.00 atm %. In the first reference example, the localization energy of excitons of the eighth well layer WL8 (the first p-side well layer 32a) is not less than the localization energy of the seventh well layer WL7 (the second p-side well layer 32b).

An example of a method for making the semiconductor light emitting element 110 according to the embodiment will now be described.

For example, organic cleaning and acid cleaning of the substrate 5 of c-plane sapphire are performed. The substrate 5 is placed in the reaction chamber of a MOCVD apparatus and is heated to about 1100° C. on the susceptor of the reaction chamber. Thereby, the oxide film of the front surface of the substrate 5 is removed.

The buffer layer 6 is grown with a thickness of 30 nm on a major surface (the c plane) of the substrate 5. Then, an undoped GaN layer that is used to form the second n-side layer 12 is grown with a thickness of 3 μm on the buffer layer 6. Continuing, a Si-doped GaN layer that is used to form the first n-side layer 11 is grown with a thickness of 2 μm on the second n-side layer 12.

The multilayered structural body 40 is formed by alternately stacking the first layer and the second layer on the first n-side layer 11. The first layer includes $In_xGa_{1-x}N$ (0≤x<1); and the second layer includes $In_yGa_{1-y}N$ (0<y<1 and x<y). The number (the period) of stacks of the first layer and the second layer is, for example, thirty.

The light emitting unit 30 is formed on the multilayered structural body 40. In the example, eight periods of the barrier layer 31 and the well layer 32 are stacked alternately. A GaN layer is formed with a thickness of 5 nm as the barrier layer 31. An InGaN layer is formed with a thickness of 3 nm as the well layer 32. The In composition ratio of the well layer 32 is 0.13. The In composition ratio is w of $In_wGa_{1-w}N$ (0<w<1). There are cases where fluctuation occurs in the In concentration of the well layer 32. The In composition ratio is the average of the In concentration of the well layer 32. There are cases where there is fluctuation in the thickness of the well layer 32. The value of the thickness of the well layer 32 recited above is the average of the thickness of the well layer 32.

Among the eight well layers 32, the growth rate GR of the formation of the seven well layers 32 on the first semiconductor layer 10 side has a relative value of 3 (referring to FIG. 5). Among the eight well layers 32, the growth rate GR of the formation of the first p-side well layer 32a most proximal to the second semiconductor layer 20 has a relative value of 1 (referring to FIG. 5). Thereby, among the eight well layers 32, the localization energy of excitons of the seven well layers 32 on the first semiconductor layer 10 side is, for example, about 60 meV. Among the eight well layers 32, the localization energy of excitons of the first p-side well layer 32a most proximal to the second semiconductor layer 20 is, for example, about 40 meV.

The fourth p-side layer 24, the third p-side layer 23, the second p-side layer 22, and the first p-side layer 21 are formed sequentially on the light emitting unit 30. An AlGaN layer is formed with an Al composition ratio of 0.003 and a thickness of 5 nm as the fourth p-side layer 24. A Mg-doped AlGaN layer is formed with an Al composition ratio of 0.1 and a thickness of 10 nm as the third p-side layer 23. A Mg-doped p-type GaN layer is formed with a thickness of 80 nm as the second p-side layer 22. The Mg concentration of the second p-side layer 22 is about $2 \times 10^{19}/cm^3$. A high-concentration Mg-doped GaN layer is formed with a thickness of 10 nm as the first p-side layer 21. The Mg concentration of the first p-side layer 21 is about $1 \times 10^{21}/cm^3$.

Subsequently, the substrate 5 on which the semiconductor stacked bodies recited above are grown is removed from the reaction chamber of the MOCVD apparatus.

A portion of the semiconductor stacked bodies is removed by dry etching. Thereby, a portion of the first n-side layer 11 is exposed. The first electrode 70 of a Ti film/Pt film/Au film is formed on the first n-side layer 11 that is exposed. On the other hand, an ITO film that is used to form the second conductive unit 82 is formed on the first p-side layer 21. The first conductive unit 81 of a Ni film/Au film is formed on a portion of the second conductive unit 82. The planar pattern of the first conductive unit 81 is, for example, a circle having a diameter of 80 mm.

Thus, the semiconductor light emitting element 110 is formed.

On the other hand, semiconductor light emitting elements of reference examples also are made by the manufacturing method recited above in which all of the eight well layers 32 are formed using the same conditions. For a semiconductor light emitting element 119b of a second reference example (the structure is not shown), the localization energy of excitons of the eight well layers 32 is 40 meV. For a semiconductor light emitting element 119c of a third reference example (the structure is not shown), the localization energy of excitons of the eight well layers 32 is 60 meV.

The dominant wavelength (the peak wavelength) of the light emitted from the semiconductor light emitting elements 110, 119b, and 119c is about 450 nm. In other words, these semiconductor light emitting elements are LEDs emitting blue light.

An example of the measurement results of the characteristics of these semiconductor light emitting elements will now be described.

Figure 6:
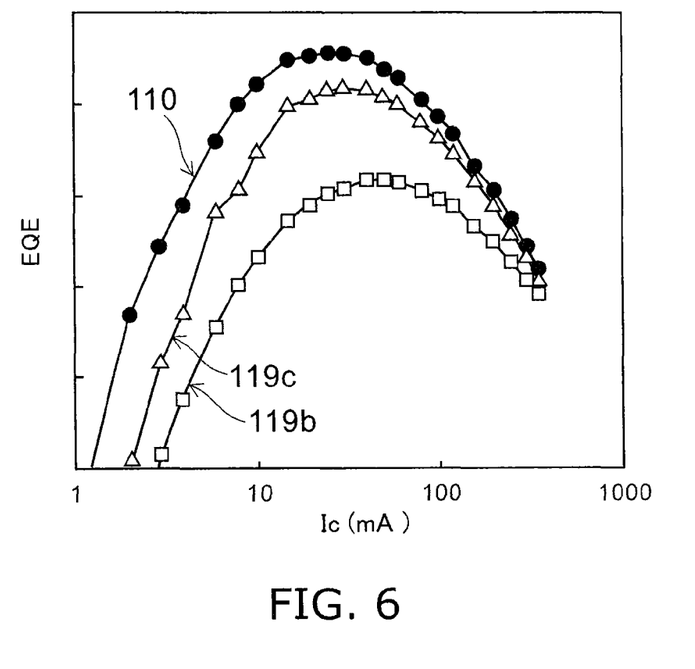
FIG. 6 is a graph showing characteristics of the semiconductor light emitting elements.

FIG. 6 is a graph illustrating characteristics of the semiconductor light emitting elements.

FIG. 6 shows the evaluation results of the external quantum efficiency for the semiconductor light emitting elements 110, 119b, and 119c. In FIG. 6, the horizontal axis is a current Ic (mA). The vertical axis is the external quantum efficiency EQE (a relative value).

It can be seen from FIG. 6 that a higher external quantum efficiency is obtained for the semiconductor light emitting element 110 according to the embodiment than for the semiconductor light emitting element 119b of the second reference example and the semiconductor light emitting element 119c of the third reference example.

Thus, according to the embodiment, a highly efficient semiconductor light emitting element is obtained.

Second Embodiment

The embodiment relates to a method for manufacturing the semiconductor light emitting element.

Figure 7:
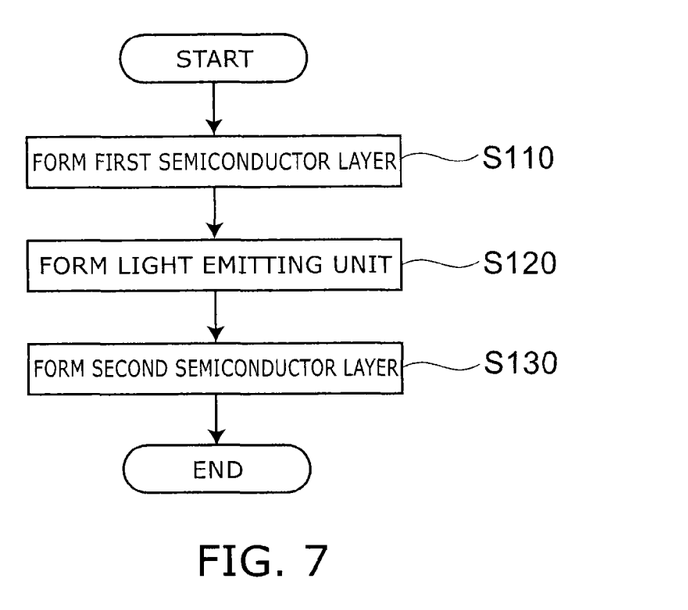
FIG. 7 is a flowchart showing the method for manufacturing the semiconductor light emitting element according to the second embodiment.

FIG. 7 is a flowchart illustrating the method for manufacturing the semiconductor light emitting element according to the second embodiment.

As shown in FIG. 7, the method for manufacturing the semiconductor light emitting element according to the embodiment includes a process of forming the first semiconductor layer 10 of the n-type including a nitride semiconductor (step S110).

The manufacturing method further includes a process of forming the light emitting unit 30 including the multiple well layers 32 and the multiple barrier layers 31 by alternately stacking the multiple well layers 32 with the multiple barrier layers 31 on the first semiconductor layer 10 (step S120).

The manufacturing method further includes a process of forming the second semiconductor layer 20 of the p-type including a nitride semiconductor on the light emitting unit 30 (step S130).

The multiple well layers 32 include the first p-side well layer 32a that is most proximal to the second semiconductor layer 20, and the second p-side well layer 32b that is second most proximal to the second semiconductor layer 20. In the manufacturing method, the localization energy of excitons of the first p-side well layer 32a is set to be less than the localization energy of excitons of the second p-side well layer 32b.

For example, the growth rate GR of the second p-side well layer 32b is lower than the growth rate of the first p-side well layer 32a.

Thereby, the carrier density is relatively low; and a high efficiency is obtained also for the well layers 32 on the first semiconductor layer 10 side. According to the embodiment, a method for manufacturing a highly efficient semiconductor light emitting element can be provided.

For example, the growth rate of the second p-side well layer 32b is not less than 0.1 times the growth rate of the first p-side well layer 32a and not more than 0.5 times the growth rate of the first p-side well layer 32a. For example, the growth rate of the second p-side well layer 32b may be not less than 0.2 times the growth rate of the first p-side well layer 32a and not more than 0.4 times the growth rate of the first p-side well layer 32a.

For example, the stacking of the multiple well layers 32 is performed by supplying a Group V element (e.g., nitrogen) and a Group III element (e.g., Ga, In, etc.). For example, ammonia gas is supplied as the source material including the Group V element. For example, tri-methyl gallium (TMG) is supplied as the source material including the Group III element. For example, tri-methyl indium (TMI) may be supplied as the source material including the Group III element.

For example, the V/III ratio (the ratio of the supply amount of the Group V element to the supply amount of the Group III element) of the formation of the second p-side well layer 32b is higher than the V/III ratio of the formation of the first p-side well layer 32a. The V/III ratio may be, for example, the ratio of the supply amount of TMG gas to the supply amount of ammonia gas.

For example, the supply amount of the Group V element of the formation of the second p-side well layer 32b may be set to be the same as the supply amount of the Group V element of the formation of the first p-side well layer 32a. In such a case, for example, the supply amount of the Group III element of the formation of the second p-side well layer 32b is set to be less than the supply amount of the Group III element of the formation of the first p-side well layer 32a.

Thereby, the localization energy of excitons of the first p-side well layer 32a is set to be less than the localization energy of excitons of the second p-side well layer 32b.

For example, the fluctuation of the In concentration of the second p-side well layer 32b is higher than the fluctuation of the In concentration of the first p-side well layer 32a. For example, the fluctuation in the plane of the second p-side well layer 32b of the thickness of the second p-side well layer 32b is higher than the fluctuation in the plane of the first p-side well layer 32a of the thickness of the first p-side well layer 32a.

According to the embodiment, a highly efficient semiconductor light emitting element and a method for manufacturing the semiconductor light emitting element can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting element such as the first semiconductor layer, the second semiconductor layer, the light emitting unit, the well layer, the barrier layer, the first electrode, the second electrode, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting elements and methods for manufacturing the same practicable by an appropriate design modification by one skilled in the art based on the semiconductor light emitting device and the semiconductor light emitting elements and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
    a first semiconductor layer of an n-type including a nitride semiconductor;
    a second semiconductor layer of a p-type including a nitride semiconductor; and
    a light emitting unit provided between the first semiconductor layer and the second semiconductor layer, the light emitting unit including a plurality of well layers stacked alternately with a plurality of barrier layers,
    the well layers including a first p-side well layer most proximal to the second semiconductor layer, and a second p-side well layer second most proximal to the second semiconductor layer,
    a localization energy of excitons of the first p-side well layer being smaller than a localization energy of excitons of the second p-side well layer.

2. The element according to claim 1, wherein a thickness of the first p-side well layer is not less than 3 nanometers and not more than 6 nanometers, and a thickness of the second p-side well layer is not less than 3 nanometers and not more than 6 nanometers.

3. The element according to claim 1, wherein the localization energy of excitons of the first p-side well layer is less than 30 milli-electron volts.

4. The element according to claim 1, wherein the localization energy of excitons of the second p-side well layer is not less than 50 milli-electron volts.

5. The element according to claim 1, wherein the localization energy of excitons of the second p-side well layer is not less than 40 milli-electron volts.

6. The element according to claim 1, wherein the localization energy of excitons of the second p-side well layer is not less than 30 milli-electron volts.

7. The element according to claim 1, wherein the localization energy of excitons of the first p-side well layer is less than 40 milli-electron volts.

8. The element according to claim 1, wherein the localization energy of excitons of the first p-side well layer is less than 50 milli-electron volts.

9. The element according to claim 1, wherein fluctuation of an In concentration of the second p-side well layer is higher than fluctuation of an In concentration of the first p-side well layer.

10. The element according to claim 1, wherein fluctuation in a plane of the second p-side well layer of a thickness of the second p-side well layer is higher than fluctuation in a plane of the first p-side well layer of the thickness of the first p-side well layer.

11. The element according to claim 1, wherein the localization energy of excitons of the well layers decreases from the first semiconductor layer side toward the second semiconductor layer side.

12. The element according to claim 1, wherein a growth rate of the second p-side well layer is lower than a growth rate of the first p-side well layer.

13. A method for manufacturing a semiconductor light emitting element, comprising:
    forming a first semiconductor layer of an n-type including a nitride semiconductor;
    forming a light emitting unit including a plurality of well layers and a plurality of barrier layers by alternately stacking the well layers with the barrier layers on the first semiconductor layer; and
    forming a second semiconductor layer of a p-type including a nitride semiconductor on the light emitting unit,
    the well layers including a first p-side well layer most proximal to the second semiconductor layer, and a second p-side well layer second most proximal to the second semiconductor layer,
    a localization energy of excitons of the first p-side well layer being smaller than a localization energy of excitons of the second p-side well layer.

14. The method according to claim 13, wherein a growth rate of the second p-side well layer is lower than a growth rate of the first p-side well layer.

15. The method according to claim 13, wherein a growth rate of the second p-side well layer is not less than 0.1 times a growth rate of the first p-side well layer and not more than 0.5 times the growth rate of the first p-side well layer.

16. The method according to claim 13, wherein a growth rate of the second p-side well layer is not less than 0.2 times a growth rate of the first p-side well layer and not more than 0.4 times the growth rate of the first p-side well layer.

17. The method according to claim 13, wherein
    the stacking of the well layers is performed by supplying a Group V element and a Group III element, and
    a ratio of a supply amount of the Group V element to a supply amount of the Group III element in the forming of the second p-side well layer is higher than a ratio of the supply amount of the Group V element to a supply amount of the Group III element in the forming of the first p-side well layer.

18. The method according to claim 13, wherein
the stacking of the well layers is performed by supplying a Group V element and a Group III element,
a supply amount of the Group V element in the forming of the second p-side well layer is same as a supply amount of the Group V element in the forming of the first p-side well layer, and
a supply amount of the Group III element in the forming of the second p-side well layer is less than a supply amount of the Group III element in the forming of the first p-side well layer.

19. The method according to claim 13, wherein fluctuation of an In concentration of the second p-side well layer is higher than fluctuation of an In concentration of the first p-side well layer.

20. The method according to claim 13, wherein fluctuation in a plane of the second p-side well layer of a thickness of the second p-side well layer is higher than fluctuation in a plane of the first p-side well layer of a thickness of the first p-side well layer.

\* \* \* \* \*